(12) United States Patent
He et al.

(10) Patent No.: US 11,804,260 B2
(45) Date of Patent: Oct. 31, 2023

(54) MULTIPLEXORS UNDER AN ARRAY OF MEMORY CELLS

(71) Applicant: Micron Technology, Inc., Boise, ID (US)

(72) Inventors: Yuan He, Boise, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/746,542

(22) Filed: May 17, 2022

(65) Prior Publication Data

US 2022/0277784 A1    Sep. 1, 2022

Related U.S. Application Data

(63) Continuation of application No. 17/172,163, filed on Feb. 10, 2021, now Pat. No. 11,386,948.

(51) Int. Cl.
| | |
|---|---|
| *G11C 7/00* | (2006.01) |
| *G11C 11/4091* | (2006.01) |
| *G11C 11/4096* | (2006.01) |
| *H03K 19/173* | (2006.01) |
| *G11C 5/06* | (2006.01) |
| *G11C 11/404* | (2006.01) |

(52) U.S. Cl.
CPC ............ *G11C 11/4091* (2013.01); *G11C 5/06* (2013.01); *G11C 11/4045* (2013.01); *G11C 11/4096* (2013.01); *H03K 19/1737* (2013.01)

(58) Field of Classification Search
CPC ........................................................ G11C 8/12
USPC .................................................... 365/189.02
See application file for complete search history.

(56) References Cited

U.S. PATENT DOCUMENTS

| | | | |
|---|---|---|---|
| 10,607,995 | B2 | 3/2020 | Roberts et al. |
| 11,380,387 | B1* | 7/2022 | He ................ G11C 7/1012 |
| 11,386,948 | B1* | 7/2022 | He ................ G11C 5/025 |
| 11,587,931 | B2* | 2/2023 | He ................ G11C 11/4087 |
| 2012/0147689 | A1 | 6/2012 | Scheuerlein |
| 2015/0243362 | A1 | 8/2015 | Nigam |
| 2018/0323200 | A1 | 11/2018 | Tang et al. |
| 2019/0103406 | A1 | 4/2019 | Tang et al. |
| 2019/0164985 | A1 | 5/2019 | Lee et al. |
| 2019/0267074 | A1 | 8/2019 | Fishburn |

OTHER PUBLICATIONS

U.S. Appl. No. 16/204,224, entitled, "Memory Arrays," filed Nov. 29, 2018, 43 pages.

* cited by examiner

*Primary Examiner* — Hoai V Ho
(74) *Attorney, Agent, or Firm* — Brooks, Cameron & Huebsch, PLLC (57) ABSTRACT

A sense amplifier can be formed outside of/horizontally adjacent to an array of vertically stacked tiers of memory cells. Memory cells can be sensed via multiplexors formed under the array that can operate to couple vertical sense lines (to which the memory cells are coupled) to horizontal sense lines (to which the sense amplifier is coupled).

20 Claims, 8 Drawing Sheets

MULTIPLEXORS UNDER AN ARRAY OF MEMORY CELLS

PRIORITY INFORMATION

This application is a Continuation of U.S. application Ser. No. 17/172,163, filed on Feb. 10, 2021, the contents of which are incorporated herein by reference.

TECHNICAL FIELD

The present disclosure relates generally to memory devices, and more particularly, to multiplexors under an array of memory cells.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory, cross-point memory), ferroelectric random-access memory (FeRAM), or the like.

As design rules shrink, less semiconductor space is available to fabricate memory, including DRAM arrays. A respective memory cell for DRAM may include an access device (e.g., a transistor) having first and second source/drain regions separated by a channel region. A gate may oppose the channel region and be separated therefrom by a gate dielectric. An access line, which is sometimes referred to in the art as a word line, is electrically connected to the gate of the DRAM cell. A DRAM cell can include a storage node, such as a capacitor cell, coupled by the access device to a sense line, which is sometimes referred to in the art as a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Embodiments of the present disclosure describe multiplexors under an array of memory cells. A vertical three-dimensional (3D) memory (e.g., 3D-DRAM) in accordance a number of embodiments of the present disclosure can include an array of memory cells made up of vertically stacked tiers of memory cells. The memory cells are controlled and/or accessed via vertical sense lines running through the tiers of memory cells and horizontal access lines running within respective tiers of memory cells. The horizontal access lines can be coupled to a number of access line drivers via staircase connection, thereby providing power to subsets of the vertical sense lines via the respective horizontal access line. The vertical sense lines can be coupled to respective horizontal sense lines that are formed under the array. The horizontal sense lines can be coupled to respective sense amplifiers outside of the array. The vertical sense lines can each be coupled to the respective horizontal sense line via a respective multiplexor, which allows individual vertical sense lines to be activated and/or deactivated for reading and writing operations, among other operations.

Embodiments of the present disclosure provide for simplified circuitry formed under an array of memory cells (e.g., an array of vertically stacked tiers of memory cells). In at least one embodiment, the circuitry formed under the array can be simplified by not including sense amplifiers, which can instead be located outside of the array and/or horizontally adjacent to the array. Such simplified circuitry can occupy less space under the array, which will make more vertical spaces available for forming memory cells within the array. Therefore, the embodiments of the present disclosure can increase cell storage density of the array of vertically stacked tiers of memory cells (e.g., a quantity of memory cells within a particular space/volume).

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 103 may reference element "03" in FIG. 1, and a similar element may be referenced as 203 in FIG. 2. Analogous elements within a Figure may be referenced with a hyphen and extra numeral or letter. Such analogous elements may be generally referenced without the hyphen and extra numeral or letter. For example, elements 103-1, 103-2, 103-A in FIG. 1 may be collectively referenced as 103. As used herein, the designators "A", "B", "Q", "P", and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
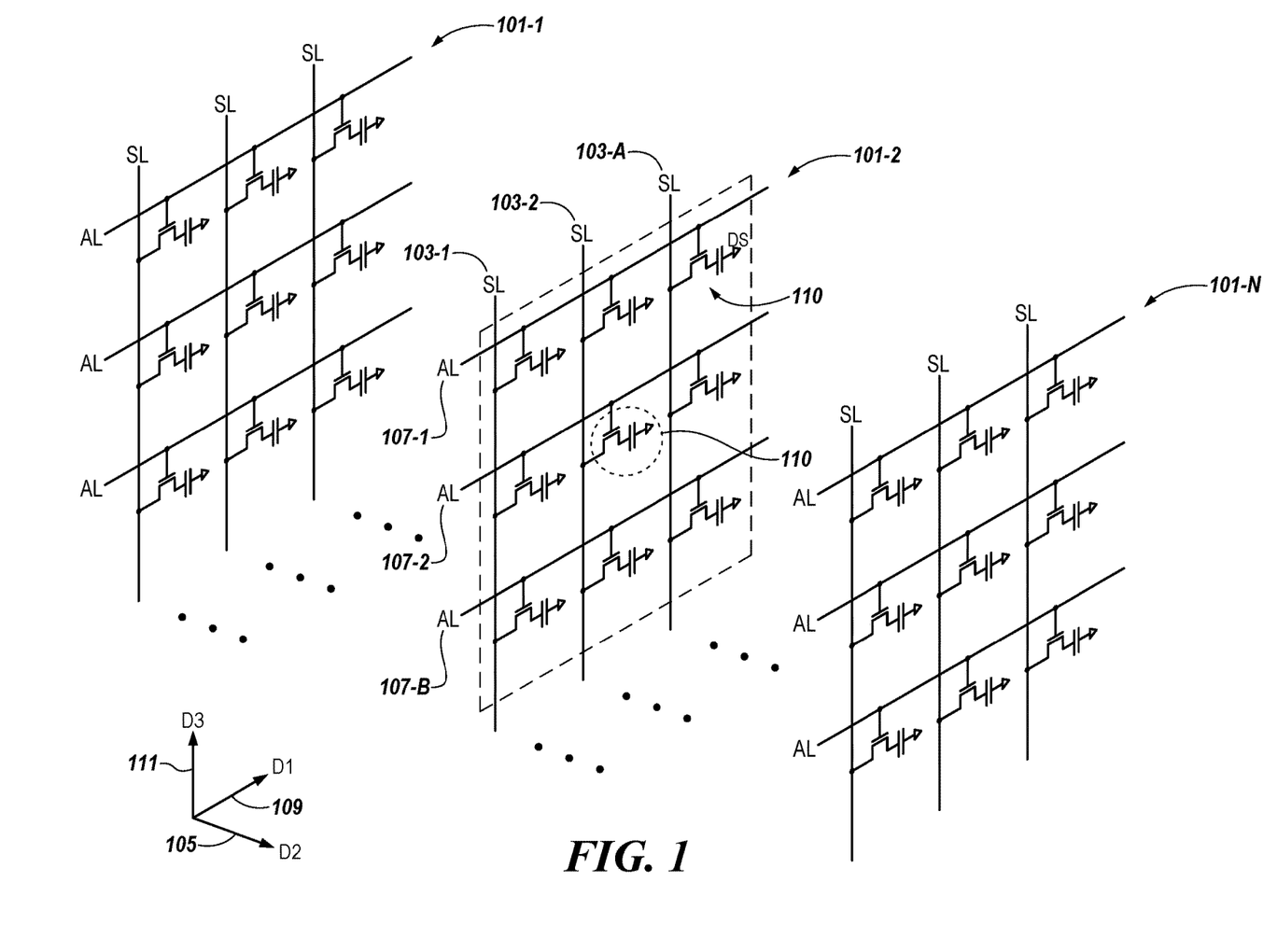
FIG. 1 is a schematic illustration of a portion of a vertical three dimensional (3D) memory in accordance a number of embodiments of the present disclosure.

FIG. 1 is a schematic illustration of a portion of a vertical 3D memory in accordance a number of embodiments of the present disclosure. FIG. 1 illustrates a circuit diagram showing a cell array of a portion of a 3D semiconductor memory device according to embodiments of the present disclosure. FIG. 1 illustrates a cell array may have a plurality of sub cell arrays 101-1, 101-2, ..., 101-N. The sub cell arrays 101-1, 101-2, ..., 101-N may have various configurations. For instance, the sub cell arrays 101-1, 101-2, ..., 101-N may be arranged along a second direction (D2) 105. Each of the sub cell arrays 101-2 may include a plurality of access lines 107-1, 107-2, ..., 107-B (which also may be referred to as word lines). Also, each of the sub cell arrays 101-2 may include a plurality of sense lines 103-1, 103-2, ..., 103-A (which also may be referred to as bit lines, data lines, or digit lines). In FIG. 1, the access lines 107-1, 107-2, ..., 107-B are illustrated extending in a first direction (D1) 109 and the sense lines 103-1, 103-2, ..., 103-A are illustrated extending in a third direction (D3) 111; however, embodiments are not so limited. The first direction (D1) 109 and the second direction (D2) 105 may be considered in a horizontal ("X-Y") plane. The third direction (D3) 111 may be considered in a vertical ("Z") plane. Hence, according to a number of embodiments described herein and as illustrated in FIG. 1, the sense lines 103-1, 103-2, ..., 103-A are extending in a vertical direction (the third direction (D3) 111); however, embodiments are not so limited. For instance, according to a number of embodiments described herein the sense lines 103-1, 103-2, ..., 103-A may extend in a horizontal direction (direction (D1) 109).

As mentioned, embodiments are not limited to the schematic illustration of FIG. 1. One or more embodiments provide that the sense lines 103-1, 103-2, ..., 103-A may extend in the first direction (D1) 109 and the access lines 107-1, 107-2, ..., 107-B may extend in the third direction (D3) 111. As such, one or more embodiments provide that the sense lines 103-1, 103-2, ..., 103-A may extend in a horizontal direction and that the access lines 107-1, 107-2, ..., 107-B extend in a vertical direction.

A memory cell 110 may include an access device (e.g., transistor) and a storage node located at an intersection of each access line 107-1, 107-2, ..., 107-B and each sense line 103-1, 103-2, ..., 103-A. Memory cells may be written to, or read from, using the access lines 107-1, 107-2, ..., 107-B and sense lines 103-1, 103-2, ..., 103-A. As shown in FIG. 1, the access lines 107-1, 107-2, ..., 107-B may conductively interconnect memory cells along horizontal rows of each sub cell array 101-, 101-2, ..., 101-N, and the sense lines 103-1, 103-2, ..., 103-A may conductively interconnect memory cells along vertical columns of each sub cell array 101-, 101-2, ..., 101-N. One memory cell 110 may be located between one access line 107-2 and one sense line 103-2. Each memory cell may be uniquely addressed through a combination of an access line 107-1, 107-2, ..., 107-B and a sense line 103-1, 103-2, ..., 103-A.

The access lines 107-1, 107-2, ..., 107-B may be or include conducting patterns (e.g., metal lines) disposed on and spaced apart from a substrate. As shown in FIG. 1, the access lines 107-1, 107-2, ..., 107-B may extend in a first direction (D1) 109. The access lines 107-1, 107-2, ..., 107-B in one sub cell array 101-2, may be spaced apart from each other in a vertical direction (the third direction (D3) 111). However, embodiments are not limited as such.

The sense lines 103-1, 103-2, ..., 103-A may be or include conductive patterns (e.g., metal lines) extending in a vertical direction, as shown in FIG. 1, with respect to the substrate (the third direction (D3) 111). The sense lines in one sub cell array 101-2, may be spaced apart from each other in the first direction (D1) 109. However, embodiments are not limited as such.

A gate of a memory cell 110 may be connected to an access line 107-2, and a first conductive node (e.g., first source/drain region) of an access device (e.g., transistor) of the memory cell 110 may be connected to a sense line 103-2. Each of the memory cells 110 may be connected to a storage node (e.g., capacitor). A second conductive node (e.g., second source/drain region) of the access device (e.g., transistor) of the memory cell 110 may be connected to the storage node (e.g., capacitor). While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a sense line 103-2 and the other may be connected to a storage node.

Figure 2A:
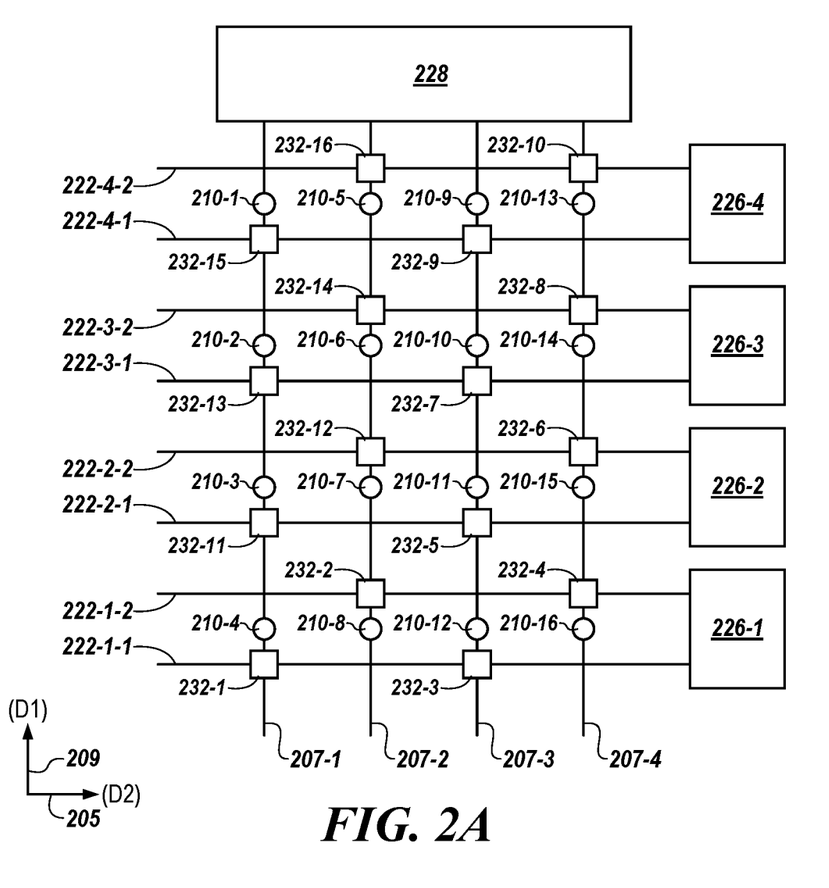
FIG. 2A is a first plane view of a portion of a 3D memory in accordance a number of embodiments of the present disclosure.

FIG. 2A is a first view of a portion of a 3D memory in accordance a number of embodiments of the present disclosure. The view in FIG. 2A shows a a portion of the 3D memory including a cross-section view of a bottom portion of the 3D memory including horizontal sense lines 222 and sense amplifiers 226 as well as a cross-section view of another bottom portion of the 3D memory including memory cells 210 and horizontal access lines 207. The portion of the 3D memory illustrated in FIG. 2A in the first direction 209 (D1) and the second direction 205 (D2) that are corresponding to the first direction 109 (D1) and the second direction 105 (D2), respectively, as illustrated in connection with FIG. 1.

FIG. 2A illustrates memory cells 210 respectively coupled to horizontal access lines 207. For example, the memory cells 210-1, 210-2, 210-3, 210-4 are coupled to the horizontal access line 207-1; the memory cells 210-5, 210-6, 210-7, 210-8 are coupled to the horizontal access line 207-2; the memory cells 210-9, 210-10, 210-11, 210-12 are coupled to the horizontal access line 207-3; and the memory cells 210-13, 210-14, 210-15, 210-16 are coupled to the horizontal access line 207-4. FIG. 2A illustrates pairs of horizontal sense lines 222 respectively coupled to sense amplifiers 226, which are formed outside of an array of vertically stacked tiers of memory cells (and/or located horizontally adjacent to the array). For example, the pair of horizontal sense lines 222-1 (horizontal sense lines 222-1-1 and 222-1-2) is coupled to the sense amplifier 226-1; the pair of horizontal sense lines 222-2 (horizontal sense lines 222-2-1 and 222-2-2) is coupled to the sense amplifier 226-2; the pair of horizontal sense lines 222-3 (horizontal sense lines 222-3-1 and 222-3-2) is coupled to the sense amplifier 226-3; and the pair of horizontal sense lines 222-4 (horizontal sense lines 222-4-1 and 222-4-2) is coupled to the sense amplifier 226-4.

Further, the memory cells 210 are coupled to the horizontal sense lines 222 via respective multiplexers 232. For example, the memory cells 210-4 and 210-12 are coupled to the horizontal sense lines 222-1-1 via multiplexors 232-1 and 232-3, respectively; the memory cells 210-8 and 210-16 are coupled to the horizontal sense lines 222-1-2 via multiplexors 232-2 and 232-4, respectively; the memory cells 210-3 and 210-11 are coupled to the horizontal sense lines 222-2-1 via multiplexors 232-11 and 232-5, respectively; the memory cells 210-7 and 210-15 are coupled to the horizontal sense lines 222-2-2 via multiplexors 232-12 and 232-6, respectively; the memory cells 210-2 and 210-10 are coupled to the horizontal sense lines 222-3-1 via multiplexors 232-13 and 232-7, respectively; the memory cells 210-6 and 210-14 are coupled to the horizontal sense lines 222-3-2 via multiplexors 232-14 and 232-8, respectively; the memory cells 210-1 and 210-9 are coupled to the horizontal sense lines 222-4-1 via multiplexors 232-15 and 232-9, respectively; and the memory cells 210-5 and 210-13 are coupled to the horizontal sense lines 222-4-2 via multiplexors 232-16 and 232-10, respectively.

Each horizontal access line 207 is coupled to a respective horizontal access line driver 228, which may be referred to in the art as a sub-word line driver. Although shown as a single element, the horizontal access line driver 228 can include multiple horizontal access line drivers and each one of the drivers can be coupled to a respective horizontal access line 207. The horizontal access line drivers 228 can be coupled to a power supply, such as a positive power supply.

As further illustrated in FIG. 2A, the horizontal access lines extend in a direction 209 (D1) and pairs of horizontal sense lines 222 extend in a direction 205 (D2). Although not shown in FIG. 2A (but shown in FIG. 2B and FIG. 2C), the pairs of horizontal sense lines 222 are further respectively coupled to vertical sense lines 203, which extend in a direction 211.

Figure 2B:
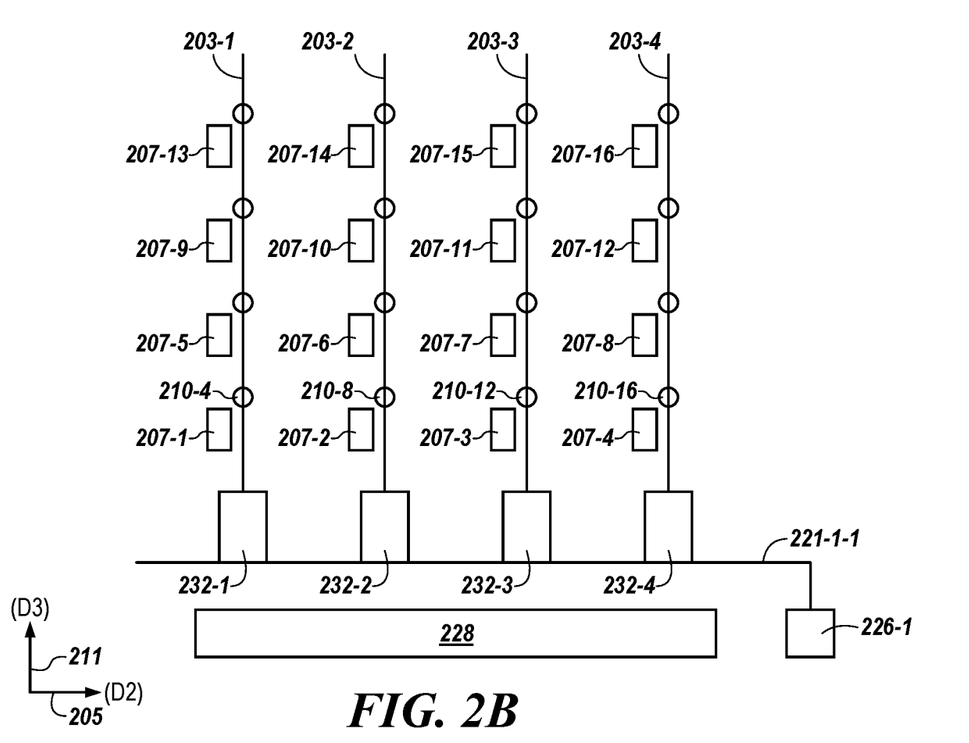
FIG. 2B is a second plane view of a portion of a 3D memory in accordance a number of embodiments of the present disclosure.

FIG. 2B is a second plane view of a portion of a 3D memory in accordance a number of embodiments of the present disclosure. The plane view in FIG. 2B shows a cross-section of a portion of the 3D memory in the third direction 211 (D3) and the second direction 205 (D2) that are corresponding to the third direction 111 (D1) and the second direction 105 (D2), respectively, as illustrated in connection with FIG. 1.

As illustrated in FIG. 2B, vertically stacked memory cells 210 are respectively coupled to vertical sense lines 203-1 to 203-4. For example, memory cells including the memory cell 210-4 (and those memory cells stacked vertically on the memory cell 210-4) are coupled to the vertical sense line 203-1; memory cells including the memory cell 210-8 (and those memory cells stacked vertically on the memory cell 210-8) are coupled to the vertical sense line 203-2; memory cells including the memory cell 210-12 (and those memory cells stacked vertically on the memory cell 210-12) are coupled to the vertical sense line 203-3; and memory cells including the memory cell 210-16 (and those memory cells stacked vertically on the memory cell 210-16) are coupled to the vertical sense line 203-4.

As further illustrated in FIG. 2B, the memory cells 210 are coupled to respective horizontal access lines 207. For example, the memory cells 210-4, 210-8, 210-12, and 210-16 are coupled to the horizontal access lines 207-1, 207-2, 207-3, and 207-4, respectively.

FIG. 2B further illustrates multiplexors 232 that are coupled to a respective pair of horizontal sense lines and formed under the array of vertically stacked memory cells. As illustrated in FIG. 2B, the multiplexors 232-1 to 232-3 are coupled to the horizontal sense line 222-1-1 (analogous to the horizontal sense line 222-1-1 illustrated in FIG. 2A). Although not illustrated in detail in FIG. 2B, the multiplexors 232-2 and 232-4 are coupled to a different one of the pair, such as the horizontal sense line 222-1-2. Further, the multiplexors 232-1, 232-2, 232-3, and 232-4 are coupled to vertical sense lines 203-1, 203-2, 203-3, and 203-4, respectively. The control circuitry (e.g., control circuitry 652 illustrated in FIG. 6) can cause the multiplexors 232 to electrically couple/decouple vertical sense lines 203 to/from respective horizontal sense lines 222. For example, the multiplexors 232-1 and 232-3 can operate to electrically couple/decouple vertical sense lines 203-1 and 203-3 to/from the horizontal sense line 222-1-1.

Figure 2C:
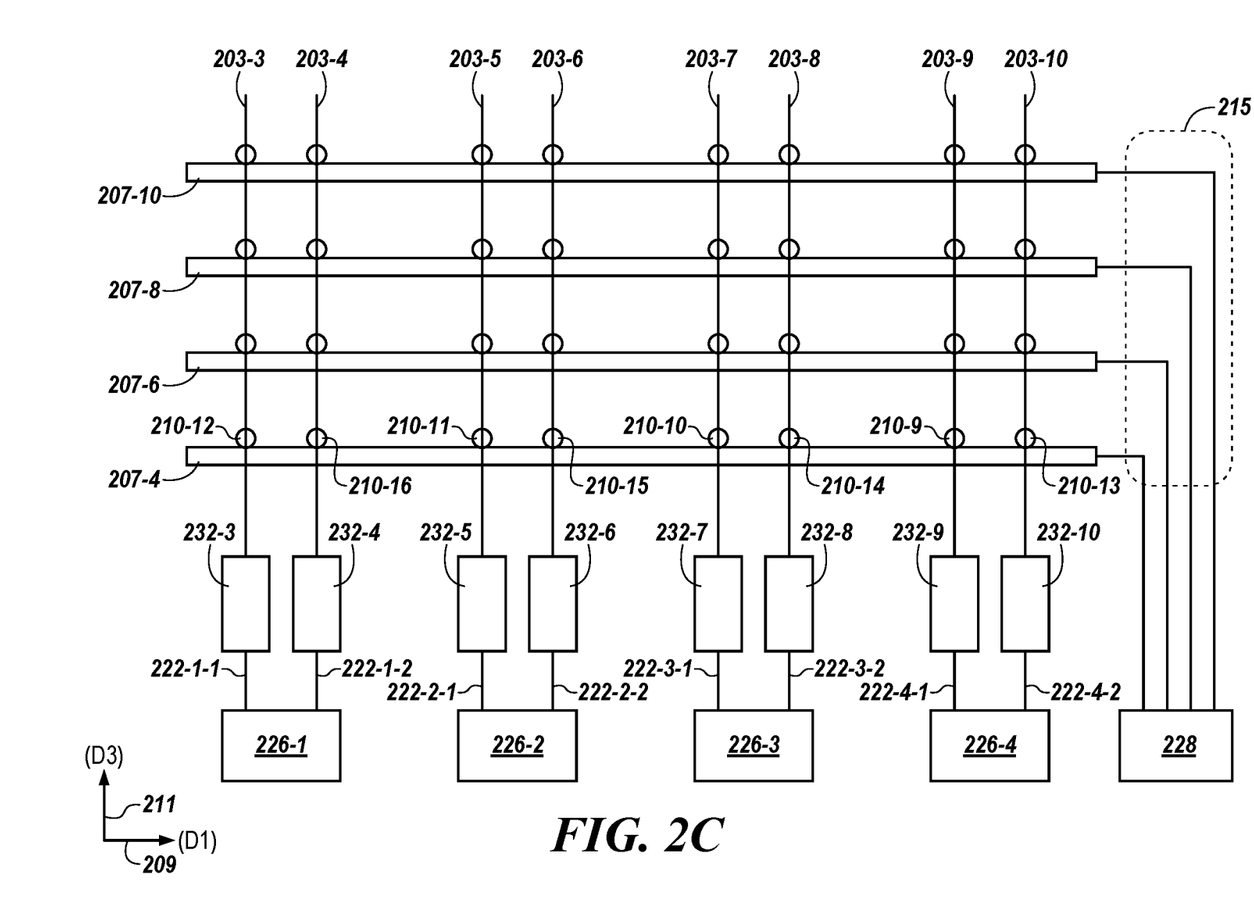
FIG. 2C is a third plane view of a portion of a 3D memory in accordance a number of embodiments of the present disclosure.

FIG. 2C is a third plane view of a portion of a 3D memory in accordance a number of embodiments of the present disclosure. The plane view in FIG. 2C shows a cross-section of a portion of the 3D memory in the third direction 211 (D3) and the first direction 209 (D1) that are corresponding to the third direction 111 (D3) and the first direction 109 (D1), respectively, as illustrated in connection with FIG. 1.

As illustrated in FIG. 2C, vertically stacked memory cells 210 are respectively coupled to the horizontal access line 207 and vertical sense lines 203. For example, memory cells 210-12, 210-11, 210-10, and 210-9 (and those memory cells stacked vertically on the memory cells 210-12, 210-11, 210-10, and 210-9) are coupled to one of the horizontal access lines (e.g., the horizontal access line 207-3) and to the vertical sense lines 203-3, 203-5, 203-7, and 203-9, respectively. Further, for example, memory cells 210-16, 210-15, 210-14, and 210-13 (and those memory cells stacked vertically on the memory cells 210-16, 210-15, 210-14, and 210-13) are coupled to the horizontal access line 207-4 and to the vertical sense lines 203-4, 203-6, 203-8, and 203-10, respectively. As further illustrated in FIG. 2C, the horizontal access lines 207 (including horizontal access line 207-4 and those horizontal access lines vertically stacked on the horizontal access line 207-4) and the horizontal access line driver 228 are coupled via staircase connection 215.

Further, as illustrated in FIG. 2C, the vertical sense lines 203-3 to 203-10 are respectively coupled to multiplexors 232-3, 232-4, 232-5, 232-6, 232-7, 232-8, 232-9, and 232-10. For example, the vertical sense lines 203-3 and 204-4 are coupled to the multiplexors 232-3 and 232-4, respectively; the vertical sense lines 203-5 and 203-6 are coupled to the multiplexors 232-5 and 232-6, respectively; the vertical sense lines 203-7 and 203-8 are coupled to the multiplexors 232-7 and 232-8, respectively; and the vertical sense lines 203-9 and 203-10 are coupled to the multiplexors 232-9 and 232-10, respectively.

Each multiplexor can operate to couple/decouple a vertical sense line 203 to a respective horizontal sense line 222. For example, the multiplexor 232-3 operates to couple/decouple the vertical sense line 203-3 to/from one of the pair of horizontal sense lines 222-1-1; the multiplexor 232-4 operates to couple/decouple the vertical sense line 203-4 to/from another one of the pair of horizontal sense lines 222-1-2; the multiplexor 232-5 operates to couple/decouple the vertical sense line 203-5 to/from one of the pair of horizontal sense lines 222-2-1; the multiplexor 232-6 operates to couple/decouple the vertical sense line 203-6 to/from another one of the pair of horizontal sense lines 222-2-2; the multiplexor 232-7 operates to couple/decouple the vertical sense line 203-7 to/from one of the pair of horizontal sense lines 222-3-1; the multiplexor 232-8 operates to couple/decouple the vertical sense line 203-8 to/from another one of the pair of horizontal sense lines 222-3-2; the multiplexor 232-9 operates to couple/decouple the vertical sense line 203-9 to/from one of the pair of horizontal sense lines 222-4-1; and the multiplexor 232-10 operates to couple/ decouple the vertical sense line 203-10 to/from another one of the pair of horizontal sense lines 222-4-2.

Figure 3:
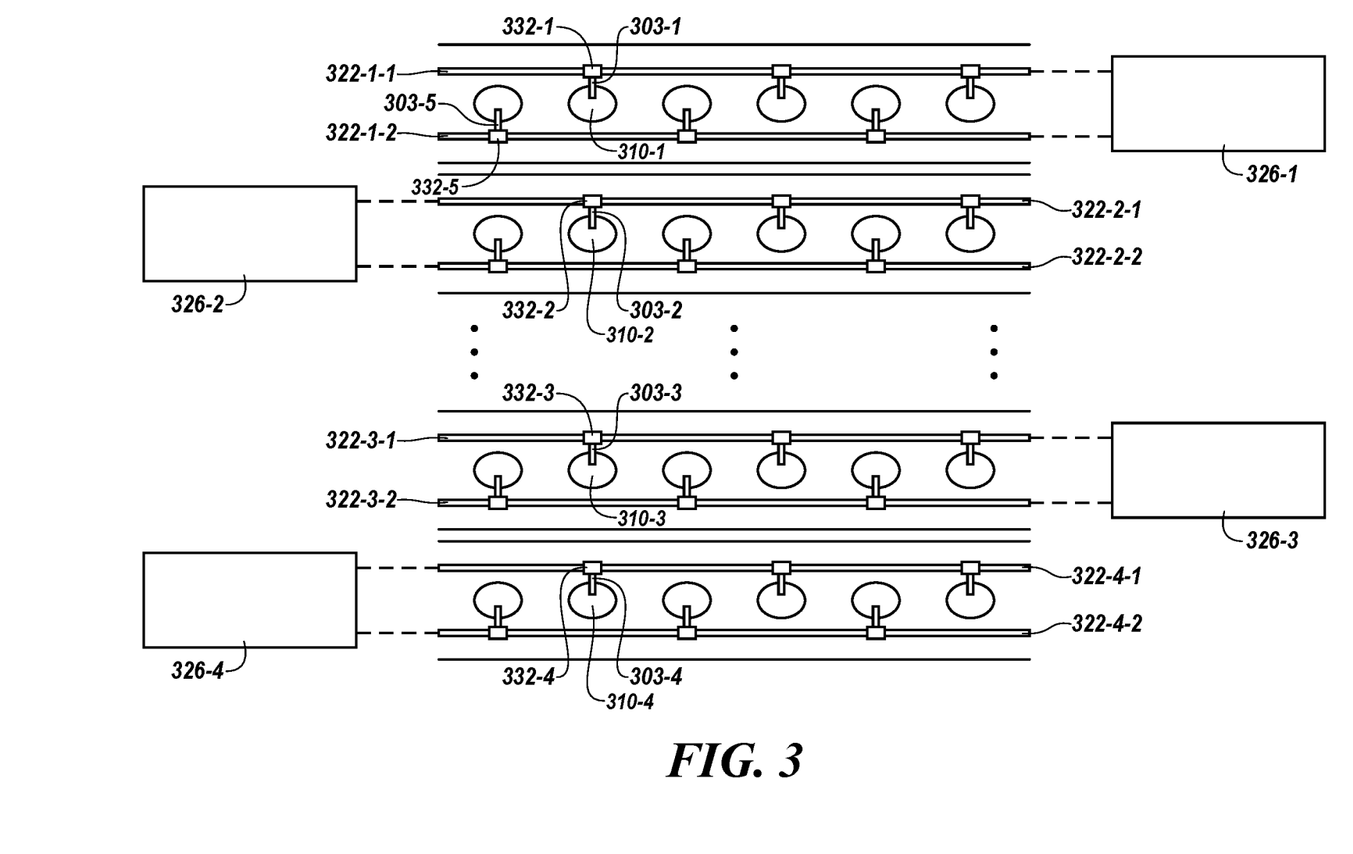
FIG. 3 is a top-down view of a portion of a vertical 3D memory in accordance a number of embodiments of the present disclosure.

FIG. 3 is a top-down view of a portion of a vertical 3D memory 321 in accordance a number of embodiments of the present disclosure. Memory cells 310 illustrated in FIG. 3 represent memory cells that are located on a same tier (e.g., one of the tiers 430 illustrated in connection with FIG. 4).

Memory cells 310 illustrated in FIG. 3 are respectively coupled to vertical sense lines 303. For example, memory cells 310-1, 310-2, 310-3, and 310-4 are respectively coupled to vertical sense lines 303-1, 303-2, 303-3, and 303-4, which are further coupled to multiplexors 332-1, 332-2, 332-3, and 332-4, respectively. Although not illustrated in FIG. 3, the memory cells 310-1, 310-2, 310-3, and 310-4 are coupled to a same horizontal access line 307. Memory cells 310 that are coupled to a same horizontal access line 307 can be accessed together as a unit. For example, the control circuitry (e.g., control circuitry 652 illustrated in FIG. 6) can cause multiplexors 332-1 to 332-4 to electrically couple respective vertical sense lines (to which memory cells 310-1 to 310-4 are coupled) to one of each pair of horizontal sense lines, such as horizontal sense lines 322-1-1, 322-2-1, 322-3-1, and 322-4-1 to allow access to the memory cells 310-1 to 310-4.

As further illustrated in FIG. 3, each pair of horizontal sense lines 322 is coupled to a respective sense amplifier 326, which is formed outside of an array of vertically stacked tiers of memory cells (and/or located horizontally adjacent to the array). For example, the pair of horizontal sense lines 322-1-1 and 322-1-2 is coupled to the sense amplifier 326-1; the pair of horizontal sense lines 322-2-1 and 322-2-2 is coupled to the sense amplifier 326-2; the pair of horizontal sense lines 322-3-1 and 322-3-2 is coupled to the sense amplifier 326-3; and the pair of horizontal sense lines 322-4-1 and 322-4-2 is coupled to the sense amplifier 326-4. The sense amplifiers 326 can be differential sense amplifiers and configured to measure (to sense data states of memory cells) as a differential voltage between two horizontal sense lines of the respective pair. For example, to sense a data state of the memory cell 310-1, the control circuitry (e.g., the control circuitry 652 illustrated in FIG. 6) can cause multiplexors 332-1 and 332-5 to electrically couple vertical sense lines 303-1 and 303-5 to the horizontal sense lines 322-1-1 and 322-1-2, respectively, activate an access line driver coupled to the memory cell 310-1, and cause the sense amplifier 326-1 to sense a differential voltage between the horizontal sense lines 322-1-1 and 322-1-2. Further details of how sense amplifiers 326 and multiplexors 332 operate in relation to horizontal sense lines 322 are described in connection with FIG. 4.

Although embodiments are not so limited, vertical sense lines, such as vertical sense lines 303, can be spaced apart from one another by a particular distance, such as 695 nanometers (nm). Further, horizontal sense lines of each pair can be spaced apart from each other by a particular size, such as 60 nm, and one pair of horizontal sense lines can be spaced part from a different pair of horizontal sense lines by 60 nm, although embodiments are not so limited.

The sense amplifiers 326 can be coupled to either one of two ends of pairs of horizontal sense lines 322. For example, sense amplifiers 326-1 and 326-3 are coupled to one end of pairs of horizontal sense lines 322-1 and 322-3, respectively, while sense amplifiers 326-2 and 326-4 are coupled to an opposite end of pairs of horizontal sense lines 322-2 and 322-4, respectively, as illustrated in FIG. 3. Although embodiments are not so limited, a sense amplifier, such as at least one of the sense amplifiers 336, can run by 4.6 micrometers (μm) in the D2 direction (e.g., the second direction (D2) 205 as illustrated in FIG. 2B) and by 1 μm in the D1 direction (e.g., the first direction (D1) 209 as illustrated in FIG. 2A). Although not shown in FIG. 3, access line drivers can be coupled to either one of two ends of each one of the horizontal access lines 307, as well.

Figure 4:
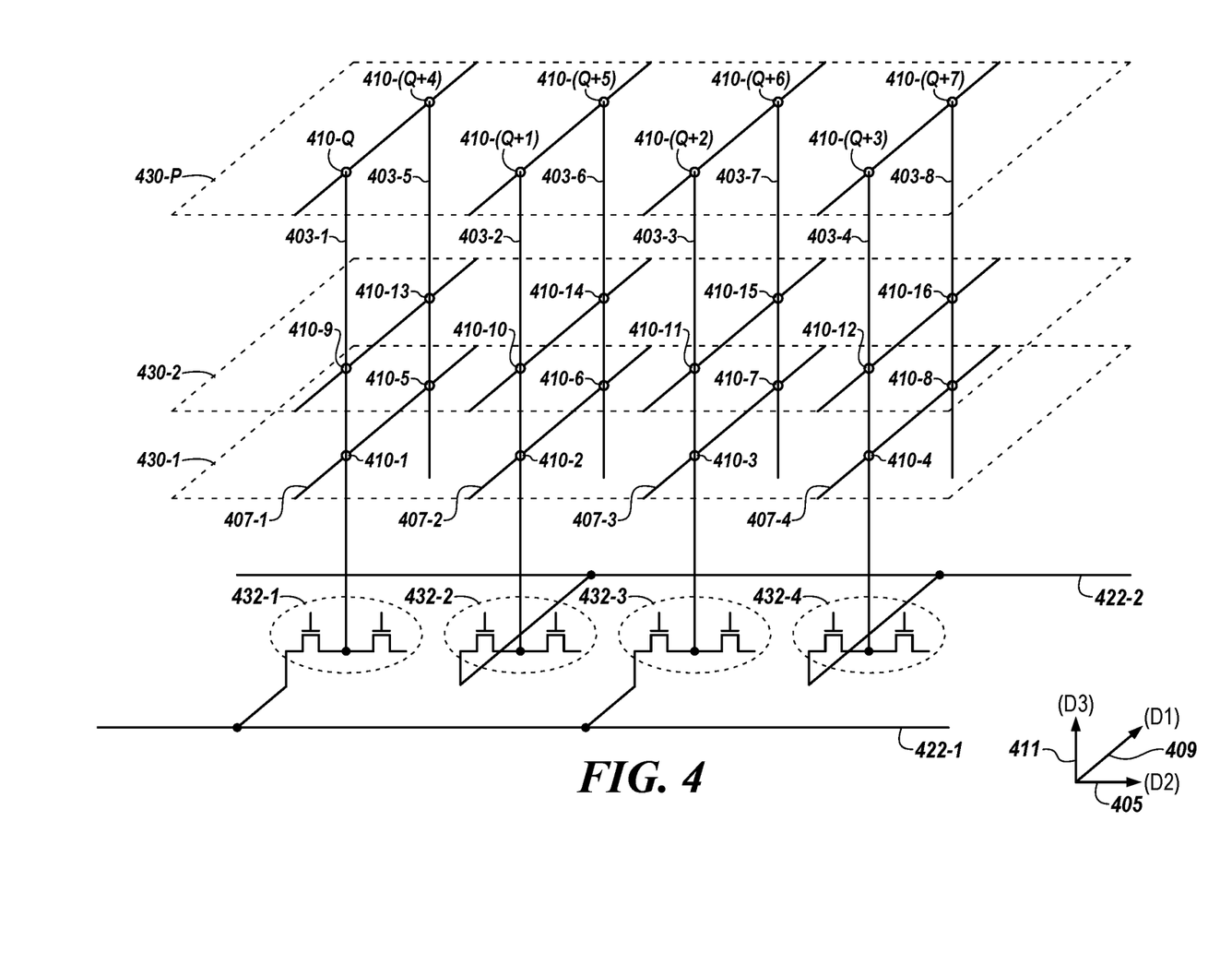
FIG. 4 is a diagram of a portion of a vertical 3D memory in accordance a number of embodiments of the present disclosure.

FIG. 4 is a diagram of a portion of a vertical 3D memory in accordance a number of embodiments of the present disclosure. The vertical 3D memory illustrated in FIG. 4 is analogous to that illustrated in FIGS. 1-3, but shown from a different perspective and with a different level of detail. A portion of a plurality of vertically stacked tiers 430-1, 430-2, . . . 430-P of memory cells in an array are illustrated. The tiers 430 are stacked vertically in the third direction 411 (D3). Also running through the tiers 430 in the third direction 411 (D3) are a plurality of vertical sense lines, such as vertical sense lines 403-1 to 403-8. Each vertical sense line 403 is coupled to one memory cell 410 in each tier 430.

Each tier 430-1, 430-2, . . . , 430-P can include memory cells coupled to respective horizontal access lines that that each run along the first direction 409 (D1) in parallel to each other. As an example, as illustrated in FIG. 4, a tier 430-1 includes memory cells 410-1 and 410-5 (coupled to a horizontal access line 407-1 and vertical sense lines 403-1 and 403-5, respectively), and memory cells 410-2 and 410-6 (coupled to a horizontal access line 407-2 and vertical sense lines 403-2 and 403-6, respectively), memory cells 410-3 and 410-7 (coupled to a horizontal access line 407-3 and vertical sense lines 403-3 and 403-7, respectively), and memory cells 410-4 and 410-8 (coupled to a horizontal access line 407-4 and vertical sense lines 403-4 and 403-8, respectively). Similarly, a tier 430-2 can include memory cells 410-9 and 410-13 (coupled to a same horizontal access line and vertical sense lines 403-1 and 403-5, respectively), 410-10 and 410-14 (coupled to a same horizontal access line and vertical sense lines 403-2 and 403-6, respectively), 410-11 and 410-15 (coupled to a same horizontal access line and vertical sense lines 403-3 and 403-7, respectively), and 410-12 and 410-16 (coupled to a same horizontal access line and vertical sense lines 403-4 and 403-8, respectively). Similarly, a tier 430-P can include 410-Q and 410-(Q+4) (coupled to a same horizontal access line and vertical sense lines 403-1 and 403-5, respectively), 410-(Q+1) and 410-(Q+5) (coupled to a same horizontal access line and vertical sense lines 403-2 and 403-6, respectively), 410-(Q+2) and 410-(Q+6) (coupled to a same horizontal access line and vertical sense lines 403-3 and 403-7, respectively), and 410-(Q+3) and 410-(Q+7) (coupled to a same horizontal access line and vertical sense lines 403-4 and 403-8, respectively), as illustrated in FIG. 4. Further, each tier 430 intersects a plurality of vertical sense lines 403, which run in the third direction 411 (D3).

As further illustrated in FIG. 4, the vertical sense lines 403-1 to 403-4 are coupled to a respective one of a pair of horizontal sense lines 422-1 and 422-2 via a respective multiplexor 432-1 to 432-4 that are formed under the array of vertically stacked memory cells. For example, as illustrated in FIG. 4, the vertical sense lines 403-1 and 403-3 are coupled to the horizontal sense line 422-1 via multiplexors 432-1 and 432-3, respectively, and the vertical sense lines 403-2 and 403-4 are coupled to the horizontal sense line 422-2 via multiplexors 432-2 and 432-4, respectively. As illustrated in connection with FIG. 4, vertical sense lines 403 include alternating vertical sense lines along the pair of horizontal sense lines 422.

The multiplexor 432-1 can operate to electrically couple/decouple the vertical sense line 403-1 to/from the horizontal sense line 422-1 (such that one of the memory cells 410-1, 410-9, and 410-Q can be accessed); the multiplexor 432-2 can operate to electrically couple/decouple the vertical sense line 403-2 to/from the horizontal sense line 422-2 (such that one of the memory cells 410-2, 410-10, and 410-(Q+1) can be accessed); the multiplexor 432-3 can operate to electrically couple/decouple the vertical sense line 403-3 to/from the horizontal sense line 422-1 (such that one of the memory cells 410-3, 410-11, and 410-(Q+2) can be accessed); and the multiplexor 432-4 can operate to electrically couple/decouple the vertical sense line 403-4 to/from the horizontal sense line 422-2 (such that one of the memory cells 410-4, 410-12, and 410-(Q+3) can be accessed).

As described herein, each multiplexor can operate to electrically couple/decouple a vertical sense line to/from a respective horizontal sense line. Although not shown in FIG. 4, a pair of horizontal sense lines 422-1 and 422-2 can be coupled to a sense amplifier (e.g., the sense amplifier 326 illustrated in FIG. 3). To sense a memory cell, the control circuitry (e.g., the control circuitry 652 illustrated in FIG. 6) can cause two multiplexers that are adjacent to each other and coupled to a pair of horizontal sense lines 422 to electrically couple one vertical sense line (to which the memory cell to be sensed is coupled) to one of the pair of horizontal sense lines and another vertical sense line to a different one of the pair of horizontal sense lines. For example, to sense the memory cell 410-1, the control circuitry can cause the multiplexor 432-1 to electrically couple the vertical sense line 403-1 to the horizontal sense line 422-1 and cause the multiplexor 432-2 to electrically couple the vertical sense line 403-2 to the horizontal sense line 422-1, while causing remaining multiplexors 432-3 and 432-4 to decouple remaining vertical sense lines (e.g., vertical sense lines 403-3 and 403-4) from respective horizontal sense lines 422-1 and 422-2. The control circuitry can further activate an access line driver (e.g., the access line driver 228 illustrated in connection with FIG. 2) to provide a positive power supply to the horizontal access line 407-1, which will further provide a differential voltage (e.g., a voltage difference between the vertical sense lines 403-1 and 403-2) to the sense amplifier via horizontal sense lines 422-1 and 422-2.

Figure 5:
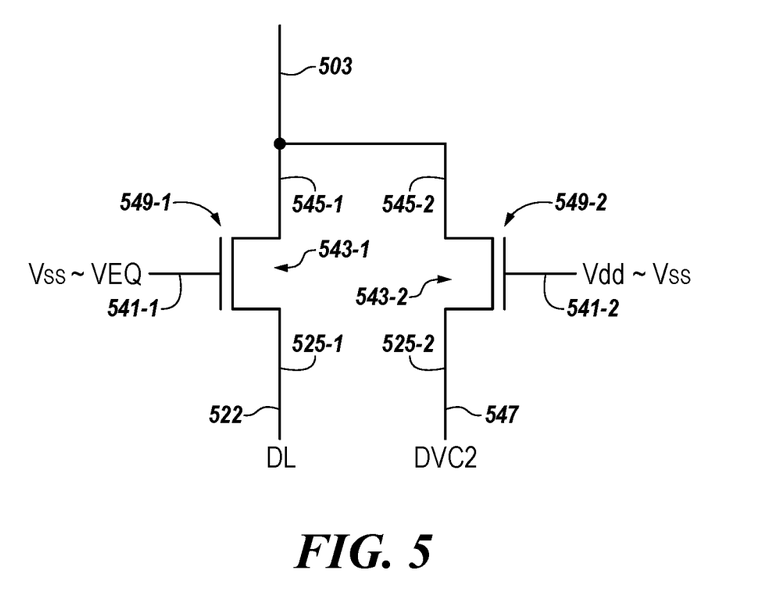
FIG. 5 is a schematic illustration of a vertical sense line multiplexor in accordance a number of embodiments of the present disclosure.

FIG. 5 is a schematic illustration of a vertical sense line multiplexor 532 in accordance a number of embodiments of the present disclosure. The multiplexor 532 can be formed under an array of memory cells comprising a plurality of vertically stacked tiers of memory cells, such as is illustrated in FIG. 4. The array can include a plurality of vertical sense lines, such as the vertical sense line 403 illustrated in FIG. 4, coupled to the tiers of memory cells. Each vertical sense line can be coupled to a respective multiplexor. For a group of vertical sense lines, the respective multiplexors function to select and/or deselect (electrically couple/decouple) the vertical sense lines to/from a horizontal sense line, such as the horizontal sense line 422 illustrated in FIG. 4.

The multiplexor 532 can include a first transistor 549-1 and a second transistor 549-2. The first transistor 549-1 can have a first terminal 545-1 coupled to a vertical sense line 503 and to a first terminal 545-2 of the second transistor 549-2. The first transistor 549-1 can have a second terminal 525-1 coupled to a horizontal sense line 522. The second transistor 549-2 can have a second terminal 525-2 coupled to a vertical channel 547 (e.g., "DVC2").

The multiplexor 532 can be configured such that deactivation of the first transistor 549-1 and activation of the second transistor 549-2 causes the respective vertical sense line 503 to be electrically coupled to the vertical channel 547. To deactivate either the first transistor 549-1 or the second transistor 549-2, a first signal ("Vss") can be applied to a gate 541-1 of the first transistor 549-1 or to a gate 541-2 of the second transistor 549-2. To activate the first transistor 549-1, a second signal ("VEQ") can be applied to a gate 541-1 of the first transistor 549-1. To activate the second transistor 549-2, a third signal ("Vdd") can be applied to a gate 541-2 of the second transistor 549-2. The multiplexor 532 can be configured such that activation of the first transistor 549-1 and deactivation of the second transistor 549-2 causes the respective vertical sense line 503 to be electrically coupled to the horizontal sense line 522.

In at least one embodiment, both the first transistor 549-1 and the second transistor 549-2 comprise n-type metal oxide semiconductor (nMOS) transistors. The multiplexors 532 can be formed as semiconductor under the array circuitry, which is sometimes referred to as complimentary metal oxide semiconductor (cMOS) under the array (CuA) circuitry. However, for embodiments in which both transistors of the multiplexor 532 are nMOS transistors, the circuitry can be referred to as nMOS under the array circuitry. The multiplexor 532, formed as nMOS under the array takes less space than if the multiplexor 532 was formed as cMOS under the array. According to at least one embodiment of the present disclosure, the multiplexors 532 formed as nMOS under the array, are able to fit directly under respective vertical sense lines 503 such that each vertical sense line 503 in the array can have an nMOS multiplexor 532 formed thereunder without sacrificing space that would otherwise be required if cMOS multiplexors were used. The use of cMOS multiplexors would not be feasible for given feature widths in current fabrication processes because the cMOS multiplexors could not fit within the given dimensions.

Figure 6:
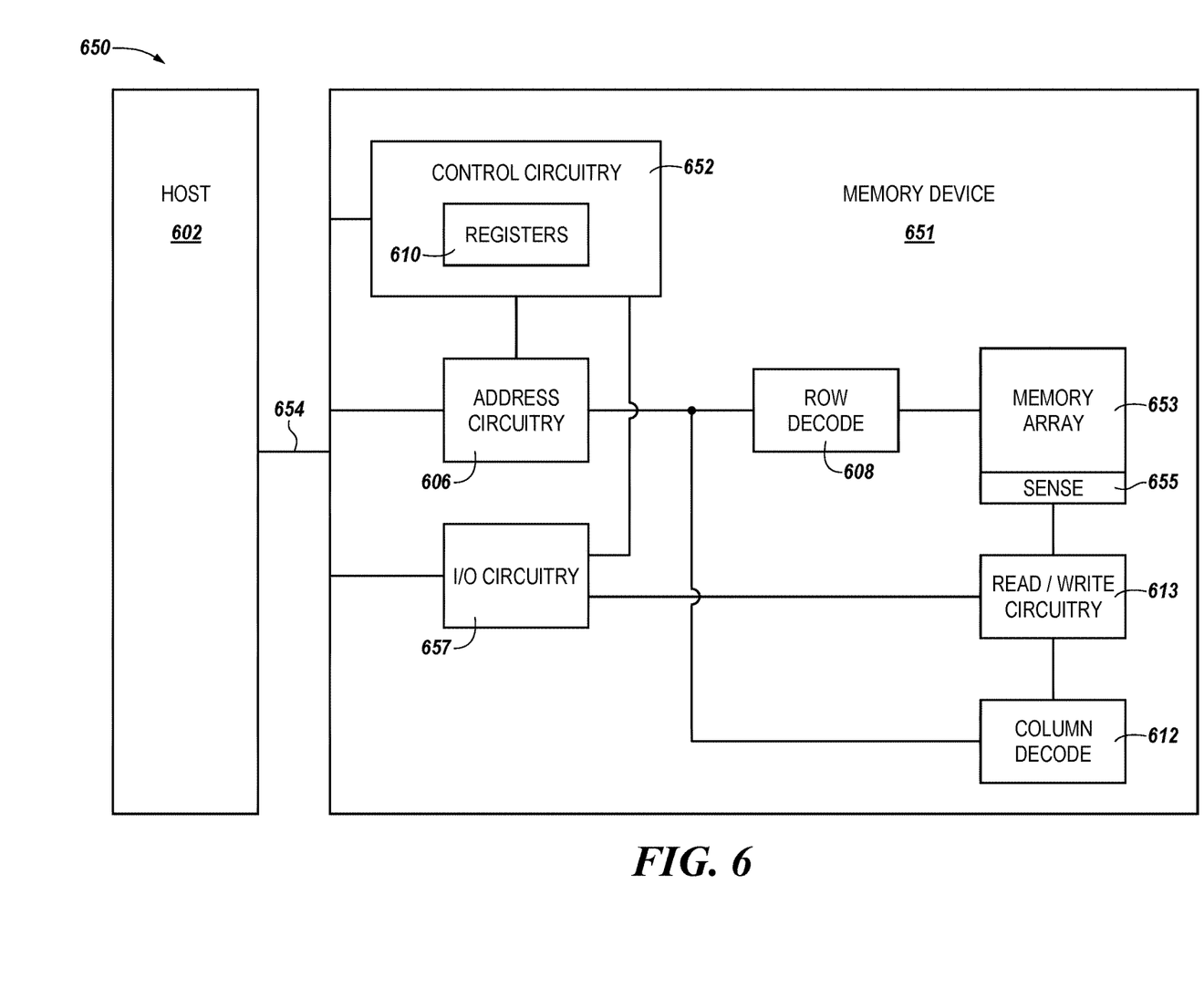
FIG. 6 is a block diagram of an apparatus in accordance with a number of embodiments of the present disclosure.

FIG. 6 is a block diagram of an apparatus in accordance with a number of embodiments of the present disclosure. FIG. 6 is a block diagram of an apparatus in the form of a computing system 650 including a memory device 651 in accordance with a number of embodiments of the present disclosure. As used herein, a memory device 651, a memory array 653, and/or a host 602, for example, might also be separately considered an "apparatus." According to embodiments, the memory device 602 may comprise at least one memory array 653 with a memory cell formed having a digit line and body contact, according to the embodiments described herein.

In this example, system 650 includes a host 602 coupled to memory device 651 via an interface 654. The interface 654 can pass control, address, data, and other signals between the memory device 651 and the host 602. The interface can include a command bus (e.g., coupled to the control circuitry 652), an address bus (e.g., coupled to the address circuitry 606), and a data bus (e.g., coupled to the input/output (I/O) circuitry 657. In some embodiments, the command bus and the address bus can be comprised of a common command/address bus. In some embodiments, the command bus, the address bus, and the data bus can be part of a common bus. The command bus can pass signals between the host 602 and the control circuitry 652 such as clock signals for timing, reset signals, chip selects, parity information, alerts, etc. The address bus can pass signals between the host 602 and the address circuitry 606 such as logical addresses of memory banks in the memory array 653 for memory operations. The interface 654 can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some cases, the control circuitry 652 is a register clock driver (RCD), such as RCD employed on an RDIMM or LRDIMM.

The computing system 650 can be a personal laptop computer, a desktop computer, a digital camera, a mobile telephone, a memory card reader, or an Internet-of-Things (IoT) enabled device, among various other types of systems. Host 602 can include a number of processing resources (e.g., one or more processors, microprocessors, or some other type of controlling circuitry) capable of accessing memory 651. The system 650 can include separate integrated circuits, or both the host 602 and the memory device 651 can be on the same integrated circuit. For example, the host 602 may be a system controller of a memory system comprising multiple memory devices 651, with the system controller 652 providing access to the respective memory devices 651 by another processing resource such as a central processing unit (CPU).

In the example shown in FIG. 6, the host 602 is responsible for executing an operating system (OS) and/or various applications (e.g., processes) that can be loaded thereto (e.g., from memory device 651 via controller 652). The OS and/or various applications can be loaded from the memory device 651 by providing access commands from the host 602 to the memory device 651 to access the data comprising the OS and/or the various applications. The host 602 can also access data utilized by the OS and/or various applications by providing access commands to the memory device 651 to retrieve said data utilized in the execution of the OS and/or the various applications.

For clarity, the system 650 has been simplified to focus on features with particular relevance to the present disclosure. The memory array 653 can be a DRAM array comprising at least one memory cell having a digit line and body contact formed according to the techniques described herein. For example, the memory array 653 can be an unshielded DL 4F2 array such as a 3D-DRAM memory array. The array 653 can comprise memory cells arranged in rows coupled by access lines (which may be referred to herein as word lines or select lines) and columns coupled by digit lines (which may be referred to herein as sense lines or data lines). Although a single array 653 is shown in FIG. 6, embodiments are not so limited. For instance, memory device 651 may include a number of arrays 653 (e.g., a number of banks of DRAM cells).

The memory device 651 includes address circuitry 606 to latch address signals provided over an interface 654. The interface can include, for example, a physical interface employing a suitable protocol (e.g., a data bus), an address bus, and a command bus, or a combined data/address/command bus. Such protocol may be custom or proprietary, or the interface 654 may employ a standardized protocol, such as Peripheral Component Interconnect Express (PCIe), Gen-Z, CCIX, or the like. Address signals are received and decoded by a row decoder 608 and a column decoder 612 to access the memory array 653. Data can be read from memory array 653 by sensing voltage and/or current changes on the sense lines using sensing circuitry 655. The sensing circuitry 655 can comprise, for example, sense amplifiers that can read and latch a page (e.g., row) of data from the memory array 653. The I/O circuitry 657 can be used for bi-directional data communication with the host 602 over the interface 654. The read/write circuitry 613 is used to write data to the memory array 653 or read data from the memory array 653. As an example, the circuitry 613 can comprise various drivers, latch circuitry, etc.

Control circuitry 652 decodes signals provided by the host 602. The signals can be commands provided by the host 602. These signals can include chip enable signals, write enable signals, and address latch signals that are used to control operations performed on the memory array 653, including data read operations, data write operations, and data erase operations. In various embodiments, the control circuitry 652 is responsible for executing instructions from the host 602. The control circuitry 652 can comprise a state machine, a sequencer, and/or some other type of control circuitry, which may be implemented in the form of hardware, firmware, or software, or any combination of the three. In some examples, the host 602 can be a controller external to the memory device 651. For example, the host 602 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:
1. A memory device, comprising:
an array of memory cells;
a first multiplexor coupled to a first horizontal sense line of a pair of horizontal sense lines that horizontally extends in a first direction, the first multiplexor verti- cally adjacent and coupled to the array via a first vertical sense line of a plurality of vertical sense lines; and a first sense amplifier horizontally adjacent to the array in the first direction, the first amplifier coupled to the array via the first horizontal sense line;

wherein the plurality of vertical sense lines are coupled to the pair of horizontal sense lines in an alternative manner such that two vertical sense lines that are horizontally adjacent in the first direction are coupled to different horizontal sense lines of the pair.

2. The memory device of claim 1, wherein:
the array further comprises first and second vertically stacked tiers of memory cells; and
the first multiplexor is coupled to the first and second tiers of memory cells via the first vertical sense line.

3. The memory device of claim 2, further comprising:
a first access line driver coupled to the first tier of memory cells; and
a second access line driver coupled to the second tier of memory cells.

4. The memory device of claim 1, further comprising a second multiplexor vertically coupled to the array via a second vertical sense line of the plurality of vertical sense lines, wherein the second multiplexor is further coupled to a second horizontal sense line of the pair.

5. The memory device of claim 4, further comprising a second sense amplifier horizontally adjacent and coupled to the array via the second horizontal sense line.

6. The memory device of claim 5, wherein the second sense amplifier is located on a first side of the array, while the first sense amplifier is located on a second side of the array.

7. The memory device of claim 4, wherein:
the array further comprises first and second vertically stacked tiers of memory cells; and
the second multiplexor is coupled to the first and second tiers of memory cells via the second vertical sense line.

8. A memory device, comprising:
an array of memory cells;
a first multiplexor coupled to a first horizontal sense line of a first pair of horizontal sense lines that horizontally extend in a first direction, the first multiplexor vertically adjacent and coupled to the array via a first vertical sense line of a plurality of vertical sense lines coupled to the first pair of horizontal sense lines;
a second multiplexor coupled to a second horizontal sense line of the first pair, the second multiplexor vertically adjacent and coupled to the array via a second vertical sense line of the plurality of vertical sense lines; and
a first sense amplifier horizontally adjacent to the array in the first direction, the first sense amplifier coupled to the array via the first pair of horizontal sense lines;
wherein the plurality of vertical sense lines are coupled to the first pair of horizontal sense lines in an alternative manner such that two vertical sense lines that are horizontally adjacent in the first direction are coupled to different horizontal sense lines of the first pair.

9. The memory device of claim 8, wherein the first sense amplifier is coupled to a respective end of the first and second horizontal sense lines.

10. The memory device of claim 8, further comprising:
a third multiplexor coupled to a third horizontal sense line of a second pair of horizontal sense lines;
a fourth multiplexor coupled to a fourth horizontal sense line of the second pair; and
a second sense amplifier horizontally adjacent and coupled to the array via the second pair of horizontal sense lines.

11. The memory device of claim 10, wherein the second sense amplifier is coupled to a respective end of the third and fourth horizontal sense lines.

12. The memory device of claim 10, wherein:
the first sense amplifier is coupled to a first side of the array; and
the second sense amplifier is coupled to a second side of the array that is opposed to the first side.

13. The memory device of claim 8, wherein:
the array of memory cells comprises first and second vertically stacked tiers of memory cells;
the first multiplexor is coupled to a first group of memory cells distributed over the first and second vertically stacked tiers of memory cells via the first vertical sense line; and
the second multiplexor is coupled to a second group of memory cells distributed over the first and second vertically stacked tiers of memory cells via the second vertical sense line.

14. The memory device of claim 13, wherein
the first tier of memory cells is coupled to a horizontal access line driver via a third horizontal sense line; and
the second tier of memory cells is coupled to the horizontal access line driver via a fourth horizontal sense line.

15. A memory device, comprising:
an array of memory cells comprising:
a first multiplexor coupled to a first horizontal sense line of a first pair of horizontal sense lines that horizontally extend in a first direction, the first multiplexor vertically adjacent and coupled to the array via a first vertical sense line of a plurality of vertical sense lines coupled to the first pair of horizontal sense lines; and
a second multiplexor coupled to a second horizontal sense line of the first pair, the second multiplexor vertically adjacent and coupled to the array via a second vertical sense line of the plurality of vertical sense lines, wherein the plurality of vertical sense lines are coupled to the first pair of horizontal sense lines in an alternative manner such that two vertical sense lines that are horizontally adjacent in the first direction are coupled to different horizontal sense lines of the first pair;
a first sense amplifier horizontally adjacent to the array in the first direction, the first sense amplifier coupled to the array via the first pair of horizontal sense lines; and
control circuitry configured to, to cause the first sense amplifier to measure a differential voltage between the first and the second horizontal senses lines and to sense a first memory cell coupled to the first vertical sense line and to a third horizontal sense line:
cause the first multiplexor to electrically couple the first vertical sense line to the first horizontal sense line; and
activate a first access line driver coupled to the third horizontal sense line to cause the first sense amplifier to measure a differential voltage between the first and the second horizontal sense lines.

16. The memory device of claim 15, wherein the control circuitry is configured to cause the second multiplexor to electrically couple the second vertical sense line to the second horizontal sense line.

17. The memory device of claim 15, further comprising:
a third multiplexor coupled to the first horizontal sense line and to the array via a third vertical sense line;
a fourth multiplexor coupled to the second horizontal sense line and to the array via a fourth vertical sense line; and
the control circuitry is configured to electrically decouple, to sense the first memory cell, the third and fourth vertical sense lines respectively from the first and second horizontal sense lines.

18. The memory device of claim 15, wherein the control circuitry is configured to, to sense a second memory cells coupled to the second vertical sense line and to a fourth horizontal sense line:
cause the second multiplexor to electrically couple the second vertical sense line to the second horizontal sense line; and
activate a second access line driver coupled to the fourth horizontal sense line.

19. The memory device of claim 18, wherein the control circuitry is configured to deactivate the first access line driver coupled to the first horizontal sense line.

20. The memory device of claim 18, wherein the control circuitry is configured to cause the first multiplexor to couple the first vertical sense line to the first horizontal sense line.

* * * * *